(12) United States Patent
Takahashi et al.

(10) Patent No.: US 8,901,535 B2
(45) Date of Patent: Dec. 2, 2014

(54) SEMICONDUCTOR NANOPARTICLE ASSEMBLY

(75) Inventors: Masaru Takahashi, Musashino (JP);
Kensaku Takanashi, Hachioji (JP);
Hideki Hoshino, Kokubunji (JP);
Kohsuke Gonda, Miyagi (JP);
Motohiro Takeda, Miyagi (JP); Noriaki Ohuchi, Miyagi (JP)

(73) Assignees: Konica Minolta Medical & Graphic, Inc., Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 13/818,849

(22) PCT Filed: Mar. 15, 2011

(86) PCT No.: PCT/JP2011/055993
§ 371 (c)(1),
(2), (4) Date: Feb. 25, 2013

(87) PCT Pub. No.: WO2012/026149
PCT Pub. Date: Mar. 1, 2012

(65) Prior Publication Data
US 2013/0153859 A1 Jun. 20, 2013

(30) Foreign Application Priority Data
Aug. 27, 2010 (JP) ................................. 2010-190352

(51) Int. Cl.
*H01L 29/06* (2006.01)
*H01L 33/06* (2010.01)
*C09K 11/02* (2006.01)
*C09K 11/88* (2006.01)
*C01B 25/22* (2006.01)

(52) U.S. Cl.
CPC ................ *H01L 33/06* (2013.01); *C09K 11/02* (2013.01); *C09K 11/025* (2013.01); *C09K 11/88* (2013.01); *C01B 25/2212* (2013.01)
USPC ............................................................ 257/13

(58) Field of Classification Search
USPC ............................................................ 257/13
See application file for complete search history.

(56) References Cited

U.S. PATENT DOCUMENTS

| 6,114,038 A | * | 9/2000 | Castro et al. ............. 428/402.24 |
| 6,875,274 B2 | * | 4/2005 | Wong et al. .................... 117/105 |
| 7,151,047 B2 | * | 12/2006 | Chan et al. ..................... 438/497 |
| 7,785,717 B2 | * | 8/2010 | Barbera-Guillem ........... 428/690 |
| 2002/0150905 A1 | * | 10/2002 | Barbera-Guillem et al. ...... 435/6 |
| 2003/0066998 A1 | * | 4/2003 | Lee ................................. 257/19 |
| 2007/0131905 A1 | | 6/2007 | Sato et al. |
| 2010/0210030 A1 | | 8/2010 | Goan et al. |
| 2011/0223110 A1 | * | 9/2011 | Bartel et al. .................... 424/9.6 |

FOREIGN PATENT DOCUMENTS

| EP | 1-795-573 | 6/2007 |
| JP | 2005/281019 A | 10/2005 |
| JP | 2008-510852 A | 4/2008 |
| JP | 2010-90356 A | 4/2010 |
| JP | 2010-132906 A | 6/2010 |
| WO | 2004/063705 | 7/2004 |
| WO | WO 2007/086189 A1 | 8/2007 |
| WO | 2008/114532 | 9/2008 |

OTHER PUBLICATIONS

L. Chen et al; CdTe Quantum Dot Functionalized Silica Nanosphere Labels for Ultrasensitive Detection of Biomarker, Chemical Communications, 2009, pp. 2670-2672.
Supplementary European Search Report EP 11 81 9625, date: Mar. 4, 2014 (4 pages).

* cited by examiner

*Primary Examiner* — Lex Malsawma
(74) *Attorney, Agent, or Firm* — Lucas & Mercanti, LLP

(57) ABSTRACT

A semiconductor nanoparticle assembly including semiconductor nanoparticles having a core/shell structure, and wherein the semiconductor nanoparticles are bonded by means of amide bonds.

6 Claims, No Drawings

SEMICONDUCTOR NANOPARTICLE ASSEMBLY

CROSS REFERENCE TO RELATED APPLICATION

This Application is a 371 of PCT/JP2011/055993 filed on Mar. 15, 2011, which claimed the priority of Japanese Patent Application No. 2010-190352 filed on Aug. 27, 2010, both applications are incorporated herein by reference in its entirety.

TECHNICAL FIELD

The present invention relates to a semiconductor nanoparticle assembly having high luminance.

BACKGROUND ART

In a case of using semiconductor nanoparticles that emit fluorescence as a fluorescent labeling agent, particles having higher luminance per particle are desired, because sensitivity becomes higher as luminance per particle becomes higher.

As semiconductor nanoparticles, ones of groups II-VI, and groups III-V are widely known. However, in the current situation, luminance per particle is far too low for these semiconductor nanoparticles to be used as a fluorescent diagnostic agent.

On the other hand, generally, core semiconductor nanoparticles alone have much lower particle luminance than that of semiconductor nanoparticles having core/shell structures. By using a semiconductor material having a larger band gap than core particles as a shell, a quantum well is formed to produce a quantum confinement effect, significantly increasing luminance.

Accordingly, a method is conceived, in which core/shell semiconductor nanoparticles are assembled, in order to increase luminance.

However, by assembling the semiconductor nanoparticles in a highly concentrated state, the particles become too close to each other to cause concentration quenching. Here, the concentration quenching occurs because the core; shell particles contact with each other to cause electron transfer, deteriorating the quantum confinement effect.

In the meantime, methods for synthesizing semiconductor nanoparticles such as the ones mentioned above in an aqueous solution and a non-aqueous solution have been developed. However, immediately after the synthesis, semiconductor nanoparticles synthesized in the solution degrades in light emitting properties due to gradual aggregation or the like of the particles. Further, the nanoparticles synthesized in the non-aqueous solution in particular are weak in moisture, rapidly degrading fluorescence properties when coexisting with a minute amount of moisture. Still further, there has been a problem that the nanoparticle solution is difficult to be applied as it is as a material from an engineering aspect.

Therefore, a method is proposed, in which the semiconductor nanoparticles are confined in a form of being dispersed and fixed in a matrix such as transparent glass or the like, so that the high luminance properties thereof can be exerted for a long period of time under various environments, and the nanoparticles become suitable for being applied from the engineering aspect.

For example, in Non-Patent Literature 1, a technique is disclosed, in which surfaces of silica beads are processed with silane coupling to amino functionalize the ends thereof, and the silica beads are reacted with carboxyl-terminated semiconductor nanoparticles to bond the two together by amide bonding. However, quantum dots only accumulate on the surfaces of the silica beads; therefore the semiconductor nanoparticles cannot be accumulated so much in respect of concentration.

Furthermore, for example in Patent Literature 1, a glass phosphor is disclosed, in which semiconductor nanoparticles are dispersed and fixed, and formed by combining a reverse micelle method and a sol-gel method in which a mixture of organic alkoxysilane having an organic functional group with good adsorption properties of molecular terminals to semiconductor nanoparticles and alkoxide is used as a glass precursor. However, degradation of the luminance properties is observed, which is caused by influence during the sol-gel reaction. Also, the method involves a presence of hydrolysis products of the organic alkoxysilane and the alkoxide, which lengthen gaps between the semiconductor nanoparticles. This causes a problem that the semiconductor particles cannot be accumulated so much in respect of concentration.

PRIOR ART DOCUMENTS

Patent Literature

[PTL 1] Japanese Patent Application Laid-open Publication No. 2005-281019

Non Patent Literature

[NPL 1] A. Chen et al., Chemical Communication, 2009, 2670

SUMMARY OF INVENTION

Technical Problem

The present invention is made in consideration of the above problems and circumstances, and it is an object of the present invention to provide a semiconductor nanoparticle assembly having high luminance and that does not cause concentration quenching even if fluorescence-emitting semiconductor nanoparticles are accumulated into a highly concentrated state.

Solution to Problem

The invention of claim 1 provides a semiconductor nanoparticle assembly containing semiconductor nanoparticles each having a core/shell structure, wherein the semiconductor particles are bonded with each other by amide bonding.

The invention of claim 2 provides the semiconductor nanoparticle assembly according to Claim 1, wherein the semiconductor nanoparticle assembly, in which the semiconductor nanoparticles are bonded with each other by the amide bonding, is formed by reacting amino-terminated core/shell semiconductor nanoparticles and carboxyl-terminated core/shell semiconductor nanoparticles.

The invention of claim 3 provides the semiconductor nanoparticle assembly according to claim 1 or 2, wherein a raw material configuring a core portion of each of the semiconductor nanoparticles having a core/shell structure is selected from a group including indium phosphor (InP), cadmium selenide (CdSe), and cadmium telluride (CdTe).

The invention of claim 4 provides the semiconductor nanoparticle assembly according to any of claims 1 to 3, wherein an average particle size thereof is within a range of 50 to 500 nm.

Advantageous Effects of Invention

According to the present invention, the semiconductor nanoparticle assembly having high luminance can be provided, in which concentration quenching does not occur even if the fluorescence-emitting semiconductor nanoparticles are accumulated into a highly concentrated state.

Generally, when semiconductor nanoparticles are accumulated into a highly concentrated state, luminance of the semiconductor nanoparticles degrades during an accumulation reaction and concentration thereof quenches, causing the luminance to become lower than total luminance corresponding to a number of core/shell semiconductor nanoparticles. However, by amide bonding the core/shell semiconductor nanoparticles as in the present invention, it is presumed that a degree of causing the luminance degradation during the accumulation reaction and the concentration quenching due to the accumulation can be reduced, and the gaps between the core/shell semiconductor nanoparticles with each other can be appropriately maintained, suppressing the occurrence of the concentration quenching.

DESCRIPTION OF EMBODIMENTS

Hereinafter, a description is made of a semiconductor nanoparticle assembly according to the present invention.

Semiconductor Nanoparticle Assembly

A semiconductor nanoparticle assembly of the present invention is the one including semiconductor nanoparticles that have a core/shell structure and are bonded with each other by amide bonding.

In the embodiment of the present invention, it is preferable to make amino-terminated semiconductor nanoparticles react with carboxyl-terminated semiconductor nanoparticles. Further, it is preferable that a material configuring each of core portions of the semiconductor nanoparticles having the core/shell structure is selected from a group consisting of indium phosphor (InP), silicon (Si), cadmium selenide (CdSe), and cadmium telluride (CdTe).

In the present application, a phrase "semiconductor nanoparticles having a core/shell structure" indicates particles each of which includes a later described semiconductor forming material (raw material), has a particle diameter of nanometers (1 to 40 nm), and has a multilayered structure configured by a core portion (center portion) and a shell portion (cover portion) covering the core portion.

In the present invention, it is preferable that an average particle diameter lies within a range of 5 to 1000 nm, and further, preferable that the average particle diameter lies within a range of 50 to 500 nm. The reason of setting the average particle diameter in a range of 50 to 500 nm is that, if the average particle diameter is less than 50 nm, a contained number of the semiconductor nanoparticles becomes small, suppressing the semiconductor nanoparticle assembly to exert high luminance. On the other hand, if the average particle diameter exceeds 500 nm, in a case of the semiconductor nanoparticle assembly being applied as a biological substance labeling agent, occurrence of an antigen-antibody reaction becomes low and once bound antigens and antibodies become dissociated, depending on size and weight of the semiconductor nanoparticle assembly.

The particle sizes of the semiconductor nanoparticles and the semiconductor nanoparticle assembly are measured by calculation using a particle size distribution obtained from a dynamic light scattering method. The particle size distribution of the semiconductor nanoparticles is measured using Zetasizer made by Malvern Instruments Ltd.

The contained number of the semiconductor nanoparticles is calculated as follows. First, regarding the semiconductor nanoparticles, an element ratio is measured using ICP-AES (ICPS-7500 made by Shimadzu Corporation), a number of moles is calculated from dry weight, and also, an absorbance is measured so that an absorbance coefficient can be calculated. Thereafter, a dry weight of the semiconductor nanoparticle assembly is calculated and an absorbance thereof is measured. A density of the semiconductor nanoparticles is known, therefore, the contained number of the semiconductor nanoparticles can be estimated together with the average particle size calculated by the above dynamic light scattering method and the absorbance of the semiconductor nanoparticle assembly.

<Core Portion Forming Material>

As a material for forming the core portion (also referred to as a "core particle") according to the present invention, a semiconductor such as Si, Ge, InN, InP, GaAs, AlSe, CdSe, AlAs, GaP, ZnTe, CdTe or InAs, or a raw material forming any of the above semiconductors can be used.

In the present invention, it is more preferable that InP, Si, CdTe or CdSe is used in particular.

<Shell Portion Forming Material>

As a material for forming the shell portion according to the present invention, inorganic semiconductors of groups II-IV, groups III-V or group IV can be used. For example, semiconductors such as Si, Ge, InN, InP, GaAs, AlSe, CdSe, AlAs, GaP, ZnTe, CdTe, InAs and the like, which have a larger band gap than the core portion forming material and have no toxicity, or raw materials forming the above semiconductors are preferable.

It is more preferable that ZnS is used as the shell portion for the InP, CdTe or CdSe core, and $SiO_2$ is used for the Si core.

Manufacturing Method of Semiconductor Nanoparticles

As a manufacturing method for the semiconductor nanoparticles according to the present invention, a liquid phase method or a gas phase method can be adopted.

The liquid phase method includes methods such as a precipitation method, a co-precipitation method, a sol-gel method, a homogeneous precipitation method and a reduction method. Moreover, a reverse micelle method and a supercritical hydrothermal synthesis method are excellent methods for preparing nanoparticles (For example, refer to Japanese Patent Application Laid-open Publication Nos. 2002-322468, 2005-239775, H10-310770, 2000-104058, and so on).

In addition, in a case of manufacturing an assembly of the semiconductor nanoparticles by the liquid phase method, it is also preferable that the method includes a process to reduce a precursor of the semiconductor through a reduction reaction.

Further, it is preferable that the method includes a process in which a reaction of the semiconductor precursor is carried out under the presence of a surfactant. Additionally, the semiconductor precursor according to the present invention is a compound including any of elements used as the above mentioned semiconductor materials, For example, if the semiconductor is Si, the semiconductor precursor may be $SiCl_4$ or the like. Other semiconductor precursors include $InCl_3$, $P(SiMe_3)_3$, $ZnMe_2$, $CdMe_2$, $GeCl_4$, tributylphosphine selenium and so on.

A reaction temperature of the reacted precursor is not limited as long as the temperature is at a boiling point or more of the semiconductor precursor, and at a boiling point or less of a solvent; however, it is preferable to set the temperature between 70 to 110° C.

Manufacturing Method of Semiconductor Nanoparticle Assembly

The semiconductor nanoparticle assembly according to the present invention can be manufactured by an amide group formation method using carbodiimide. Specifically, the method involves mixing of amino-terminated semiconductor nanoparticles and carboxyl-terminated semiconductor nanoparticles under the presence of 1-ethyl-3-(3-dimethylaminopropyl) carbodiimide hydrochloride to manufacture a semiconductor nanoparticle assembly in which the semiconductor nanoparticles are bonded with each other by amide bonding.

A particle size of the semiconductor nanoparticle assembly is determined by a mixing ratio of the amino-terminated semiconductor nanoparticles and the carboxyl-terminated semiconductor nanoparticles, and as the mixing ratio gets closer to 1:1, the particle size tends to become larger.

<Reducer>

A reducer for reducing the semiconductor precursor can be selected from conventionally known various precursors according to reaction conditions. In the present invention, from the aspect of reduction strength, lithium aluminum hydride ($LiAlH_4$), sodium borohydride ($NaBH_4$), sodium bis(2-methoxyethoxy)aluminum hydride, lithium tri(sec-butyl) borohydride ($LiBH(sec-C_4H_9)_3$), potassium tri(sec-butyl) borohydride, lithium triethyl borohydride or the like is preferable as the reducer. In particular, lithium aluminum hydride ($LiAlH_4$) is preferable because of the high reduction strength.

<Solvent>

A dispersion solvent for the semiconductor precursor can be selected from conventionally known various solvents, but it is preferable to use alcohol such as ethyl alcohol, sec-butyl alcohol or t-butyl alcohol, or a hydrocarbon solvent such as toluene, decane or hexane. In the present invention, in particular, a hydrophobic solvent such as toluene is preferable as the dispersion solvent.

<Surfactant>

A surfactant to be used in the present invention can be selected from conventionally known various surfactants which include anionic, non-ionic, cationic, and amphoteric surfactants. Among the surfactants, it is preferable to select the surfactant from tetrabutylammonium chloride, tetrabutylammonium bromide, tetrabutylammonium hexafluorophosphate, tetraoctylammonium bromide (TOAB) and tributylhexadecylphosphonium bromide, which are quaternary ammonium salt series. In particular, tetraoctylammonium bromide is preferable as the surfactant.

In addition, the reaction made by the liquid phase method significantly changes depending on a state of a compound in a solution including a solvent. This is the point to be taken care of particularly when manufacturing nanoscale particles having excellent monodispersibility. For example, in the reverse micelle reaction method, size and state of reverse micelle as a reaction field change depending on density and type of a surfactant, limiting conditions in which nanoparticles are formed. Accordingly, an appropriate combination of surfactant and solvent should be made.

The manufacturing method using the gas phase method includes: 1) a method of evaporating opposing semiconductor raw materials as electrodes by a first high-temperature plasma generated between the electrodes and passing the evaporated semiconductor raw materials through a second high-temperature plasma generated by electrodeless discharge in an atmosphere having reduced pressure (see Japanese Patent Application Laid-open Publication No. H06-279015); 2) a method of separating and removing nanoparticles from a cathode formed of a semiconductor raw material (see Published Japanese Translation of PCT Application No 2003-515459); 3) a laser abrasion method (see Japanese Patent Application Laid-open Publication No. 2004-356163); and 4) a high-speed sputtering method (see Japanese Patent Application Laid-open Publication No. 2004-296781). Furthermore, a method of performing a gas phase reaction for raw material gas in a low pressure state to synthesize powder including the particles is preferable.

Outlines of the manufacturing methods for an aggregate of the semiconductor nanoparticles and the semiconductor nanoparticle assembly are described hereinabove; however, specific methods are described in detail in the examples.

Application

Hereinafter, a representative application of the semiconductor nanoparticle assembly according to the present invention is described.

<Biological Substance Labeling Agent and Bioimaging>

The semiconductor nanoparticle assembly of the present invention can be applied to a biological substance fluorescent labeling agent. Upon adding the biological substance fluorescent labeling agent to a living cell or body having a target (tracking) substance, the agent bonds or adsorbs to the target substance. Then, the bonded or adsorbed body is irradiated with an excitation light of a predetermined wavelength, so that fluorescence of a predetermined wavelength is generated from fluorescent semiconductor fine particles according to the excitation light. Then, the fluorescence is detected, thereby fluorescence dynamic imaging of the above target (tracking) substance can be performed. In other words, the biological substance labeling agent can be applied to a bioimaging method (technical means to visualize biological molecules configuring the biological substance and a dynamic phenomenon of the biological molecules).

<<Hydrophilization of the Semiconductor Nanoparticle Assembly>>

Because the above described semiconductor nanoparticle assembly generally has a hydrophobic surface, in a case of being used as the biological substance labeling agent for example, water dispersible property thereof is too low that the semiconductor nanoparticle assembly aggregates with other assemblies. Accordingly, the surface of the semiconductor nanoparticle assembly needs to be hydrophilic treated.

A hydrophilization method includes, for example, a method in which a lipophilic group on the surface of the semiconductor nanoparticle assembly is removed using pyridine or the like, and then a surface modifying agent is chemically and/or physically bonded to the surface thereof. As the surface modifying agent, one having carboxyl group and amino group as a hydrophilic group is preferably used, and specifically, mercaptopropionic acid, mercaptoundecanoic acid, aminopropanethiol or the like is mentioned. More specifically, for example, $10^{-5}$ g of $Ge/GeO_2$ type nanoparticles are dispersed into a 10 ml pure water having 0.2 g of mercaptoundecanoic acid dissolved therein, and a mixture is agitated for 10 minutes at 40° C. to process shell surfaces, thereby the shell surfaces of inorganic nanoparticles can be modified by a carboxyl group.

<<Biological Substance Labeling Agent>>

A biological substance labeling agent can be produced by bonding the above hydrophilic treated semiconductor nanoparticle assembly and a molecular labeling substance, with an organic molecule interposed therebetween.

<<Molecular Labeling Substance>>

The biological substance labeling agent is able to label a biological substance when the molecular labeling substance specifically bonds and/or reacts with the target biological substance.

As the examples of the molecular labeling substance, nucleotide chain, antigen, antibody, cyclodextrin and the like are mentioned.

<<Organic Molecules>>

The biological substance labeling agent is formed by the hydrophilic treated semiconductor nanoparticle assembly and the molecular labeling agent being bonded together with the organic molecule interposed therebetween. As long as the organic molecule is the one that is capable of bonding the semiconductor nanoparticle assembly and the molecular labeling agent together, a type thereof is not limited. However, it is also preferable that protein such as albumin, myoglobin or casein is used, or avidin which is a type of protein is used with biotin. A mode of bonding is not particularly limited, and for example, a covalent bonding, ionic bonding, hydrogen bonding, coordinate bonding, physical adsorption or chemical adsorption can be applied. From the aspect of bonding stability, it is preferable to apply the bonding having high bonding strength such as the covalent bonding.

Specifically, in a case of hydrophilic treating the semiconductor nanoparticle assembly using mercaptoundecanoic acid, avidin and biotin can be used as the organic molecules. In this case, a carboxyl group of the hydrophilic treated nanoparticles covalently bonds to avidin in a preferable manner, the avidin then selectively bonds to biotin, and the biotin bonds to the biological substance labeling agent, thereby forming the biological substance labeling agent.

EXAMPLES

Hereinafter, a description of the present invention is made in detail using examples; however, the present invention is not limited to these examples.

1. [Examples 1 to 7]

The Present Invention (1) Synthesis of InP/ZnS Core/Shell Structured Semiconductor Nanoparticles InP core particles are synthesized by the following solution heating method.

6 ml of octadecene is put into a three-necked flask, and into the solvent, 1 ml of octadecene in which $In(acac)_3$ and tris(trimethylsilyl)phosphine are dissolved is added, so that ratios of In to P become In/P=1/1. Then the resultant is reacted at an argon atmosphere of 300° C. for an hour so that the InP core particles (dispersion) are formed.

After the reaction at 300° C. for an hour, the InP core particle dispersion thus obtained is cooled down to 80° C., and into the dispersion, 1 ml of octadecene in which zinc stearate and sulfur are dissolved is added, so that ratios of In, P, Zn and S become In/P/Zn/S=1/1/1/1. Then the resultant is heated up from 80° C. to 230° C. and is reacted for 30 minutes, thereby synthesizing the InP/ZnS core/shell particles. The InP/ZnS core/shell semiconductor nanoparticles thus obtained are particles each having a maximum emission wavelength at 630 nm.

(2) Synthesis of Carboxyl-Terminated and Amino-Terminated InP/ZnS Semiconductor Nanoparticles The above reacted dispersion is allowed to cool down to room temperature, and then 2-mercaptopropionic acid having a molar quantity of ten times as much as ZnS and ultrapure water are added thereto to synthesize the carboxyl-terminated InP/ZnS.

Thereafter, the carboxyl-terminated InP/ZnS thus obtained is reacted with (3-aminopropyl)-trimethoxysilane having a molar quantity of ten times as much as carboxyl-terminated InP/ZnS to synthesize the amino-terminated InP/ZnS.

(3) Formation of Semiconductor Nanoparticle Assembly

The carboxyl-terminated InP/ZnS and the amino-terminated InP/ZnS are mixed and strongly agitated for 12 hours under the presence of endocrine disrupting chemical (EDC) to produce the semiconductor nanoparticle assembly. Quantitative ratios of carboxyl-terminated InP/ZnS to amino-terminated InP/ZnS in respective examples are: 1:100 (Example 1); 1:50 (Example 2); 1:10 (Example 3); 1:1 (Example 4); 10:1 (Example 5); 50:1 (Example 6); and 100:1 (Example 7).

2. [Examples 8 to 14]

The Present Invention (1) Synthesis of CdSe/ZnS Core/Shell Semiconductor Nanoparticles Synthesis of CdSe/ZnS core/shell semiconductor nanoparticles is carried out as follows.

In a stream of argon, to 7.5 g of tri-n-octylphosphine oxide (TOPO), 2.9 g of stearic acid, 620 mg of n-tetradecylphosphonic acid and 250 mg of cadmium oxide are added, and heated up to 370° C. and mixed. The mixture is allowed to cool down to 270° C., and a solution in which 200 mg of selenium is dissolved in 2.5 ml of tributylphosphine is added thereto, and the resultant is dried under reduced pressure, thereby TOPO-coated CdSe core semiconductor nanoparticles are formed.

The CdSe core particles thus obtained are added with 15 g of TOPO, then thereafter, added with a solution in which 1.1 g of zinc diethyldithiocarbamate is dissolved in 10 ml of trioctylphosphine to synthesize the CdSe/ZnS core/shell semiconductor nanoparticles.

(2) Synthesis of Carboxyl-Terminated and Amino-Terminated CdSe/ZnS Semiconductor Nanoparticles The above reacted dispersion is allowed to cool down to room temperature, and then 2-mercaptopropionic acid having a molar quantity of ten times as much as ZnS and ultrapure water are added thereto to synthesize the carboxyl-terminated CdSe/ZnS. Further, the carboxyl-terminated CdSe/ZnS thus obtained is reacted with (3-aminopropyl)-trimethoxysilane having a molar quantity of ten times as much as carboxyl-terminated CdSe/ZnS to synthesize the amino-terminated CdSe/ZnS.

Formation of Semiconductor Nanoparticle Assembly

The carboxyl-terminated CdSe/ZnS, and the amino-terminated CdSe/ZnS are mixed and strongly agitated for 12 hours under the presence of EDC to produce the semiconductor nanoparticle assembly. Quantitative ratios of carboxyl-terminated CdSe/ZnS to amino-terminated CdSe/ZnS in respective examples area 1:100 (Example 8); 1:50 (Example 9); 1:10

(Example 10); 1:1 (Example 11); 10:1 (Example 12); 50:1 (Example 13); and 100:1 (Example 14).

3. [Examples 15 to 21]

The Present Invention (1) Synthesis of CdTe/ZnS Core/Shell Semiconductor Nanoparticles The CdTe/ZnS core/shell semiconductor nanoparticles are synthesized according to Example 1 described in Japanese Patent Application Laid-open Publication No. 2005-281019.

The CdTe core particles are synthesized according to *Berichte der Bunsengesellschaft für physikalische Chemie*, Volume 100, p. 1772 (1996).

In other words, under an argon gas atmosphere and the presence of thioglycolic acid ($HOOCCH_2SH$) as a surfactant, an aqueous solution of cadmium perchlorate prepared at 25° C. and pH of 11.4 is strongly agitated while being reacted with a hydrogen telluride gas. The solution is refluxed under the atmosphere for six days, thereby the CdTe core particles are formed.

The CdTe core particles thus obtained are particles each having a maximum emission wavelength at 640 nm.

Then, the solution is heated up to 80° C., and into the solution, 1 ml of water in which zinc stearate and sulfur are dissolved is added, so that ratios of Cd, Te, Zn, S become In/P/Zn/S=1/1/1/1. Then the resultant is heated up from 80° C. to 230° C. and is reacted for 30 minutes, thereby synthesizing the CdTe/ZnS core/shell particles.

(2) Synthesis of Carboxyl-Terminated and Amino-Terminated CdTe/ZnS Semiconductor Nanoparticles The above reacted dispersion is allowed to cool down to room temperature, and then 2-mercaptopropionic acid having a molar quantity of ten times as much as ZnS and ultrapure water are added thereto to synthesize the carboxyl-terminated CdTe/ZnS.

Thereafter, the carboxyl-terminated CdTe/ZnS thus obtained is reacted with (3-aminopropyl)-trimethoxysilane having a molar quantity of ten times as much as carboxyl-terminated CdTe/ZnS to synthesize the amino-terminated CdTe/ZnS.

(3) Formation of Semiconductor Nanoparticle Assembly

The carboxyl-terminated CdTe/ZnS and the amino-terminated CdTe/ZnS are mixed and strongly agitated for 12 hours under the presence of EDC to produce the semiconductor nanoparticle assembly. Quantitative ratios of carboxyl-terminated CdTe/ZnS to amino-terminated CdTe/ZnS in respective examples are: 1:100 (Example 8); 1:50 (Example 9); 1:10 (Example 10); 1:1 (Example 11); 10:1 (Example 12); 50:1 (Example 13); and 100:1 (Example 14).

4. [Examples 22 to 24]

Comparative Examples

According to Example 1 described in Japanese Patent Application Laid-open Publication No. 2005-281019, semiconductor nanoparticle assemblies which respectively include InP/ZnS, CdSe/ZnS and CdTe/ZnS in a silica matrix are prepared.

Each of the InP/ZnS, CdSe/ZnS and CdTe/ZnS core/shell semiconductor nanoparticles dispersion is made into an aqueous solution by adding thereto thioglycolic acid as a surfactant under conditions of 25° C. and pH=10, Then, to 25 ml of isooctane (or 2,2,4 trimethylpentane), 1.1115 g of bis(2-ethylhexyl) sulfosuccinate sodium (also called aerosol OT or AOT) required for forming reverse micelle (reverse microemulsion) is dissolved, and thereafter, the solution is agitated while 0.74 ml of water and 0.3 ml of each of the above aqueous solution of InP/ZnS, CdSe/ZnS and CdTe/ZnS core/shell semiconductor nanoparticles is added and dissolved. Subsequently, while agitating the solution, 0.399 ml of tetraethoxysilane (TEOS) which is alkoxide and 0.079 ml of 3-aminopropyltrimethoxysilane maps) which is organic alkoxysilane are added thereto as a precursor of sol-gel glass.

The dispersion is agitated for two days, thereby the semiconductor nanoparticle assemblies are produced, which respectively include InP/ZnS, CdSe/ZnS and CdTe/ZnS in a silica matrix.

The respective types of semiconductor nanoparticle assemblies obtained in Examples hereinabove are summarized in Table 1 shown below.

Additionally, for measuring luminance, a 146 nm vacuum ultraviolet lamp (made by Ushio Inc.) is used for a light source. A sample is set in a vacuum chamber in which a degree of vacuum is adjusted to $1.33 \times 10$ Pa and is irradiated with the light source from a fixed distance, and excited emission of the sample is measured using a luminance meter. Each value of luminance is shown as a relative value with respect to that of InP/ZnS core/shell particles in Example 1 when the value of the Example 1 is assumed to be 1.

TABLE 1

| EXAMPLE No. | SEMI-CONDUCTOR NANOPARTICLES | QUANTITATIVE RATIO OF AMINO-TERMINATED/CARBOXYL-TERMINATED SEMICONDUCTOR NANOPARTICLES | CONTAINED NUMBER* [PARTICLES] | AVERAGE PARTICLE SIZE OF ASSEMBLY [NM] | LUMINANCE OF ASSEMBLY | REMARKS |
| --- | --- | --- | --- | --- | --- | --- |
| 1 | InP/ZaS | 1:100 | 100 | 50 | 92 | PRESENT INVENTION |
| 2 | InP/ZnS | 1:50 | 820 | 120 | 760 | PRESENT INVENTION |
| 3 | InP/ZnS | 1:10 | 15000 | 380 | 13500 | PRESENT INVENTION |
| 4 | InP/ZnS | 1:1 | 850000 | 1800 | 790000 | PRESENT INVENTION |
| 5 | InP/ZnS | 10:1 | 20000 | 450 | 19400 | PRESENT INVENTION |
| 6 | InP/ZnS | 50:1 | 2500 | 220 | 2200 | PRESENT INVENTION |
| 7 | InP/ZnS | 100:1 | 180 | 70 | 150 | PRESENT INVENTION |
| 8 | CdSe/ZnS | 1:100 | 250 | 70 | 1800 | PRESENT INVENTION |
| 9 | CdSe/ZnS | 1:50 | 2100 | 180 | 18000 | PRESENT INVENTION |
| 10 | CdSe/ZnS | 1:10 | 10000 | 450 | 950000 | PRESENT INVENTION |
| 11 | CdSe/ZnS | 1:1 | 1080000 | 2900 | 8.5E+07 | PRESENT INVENTION |
| 12 | CdSe/ZnS | 10:1 | 6200 | 400 | 59000 | PRESENT INVENTION |
| 13 | CdSe/ZnS | 50:1 | 1500 | 150 | 13800 | PRESENT INVENTION |
| 14 | CdSe/ZnS | 100:1 | 150 | 50 | 1400 | PRESENT INVENTION |
| 15 | CdTe/ZnS | 1:100 | 180 | 60 | 250 | PRESENT INVENTION |

TABLE 1-continued

| EXAMPLE No. | SEMI-CONDUCTOR NANOPARTICLES | QUANTITATIVE RATIO OF AMINO-TERMINATED/CARBOXYL-TERMINATED SEMICONDUCTOR NANOPARTICLES | CONTAINED NUMBER* [PARTICLES] | AVERAGE PARTICLE SIZE OF ASSEMBLY [NM] | LUMINANCE OF ASSEMBLY | REMARKS |
|---|---|---|---|---|---|---|
| 16 | CdTe/ZnS | 1:50 | 1200 | 150 | 1600 | PRESENT INVENTION |
| 17 | CdTe/ZnS | 1:10 | 20000 | 420 | 26000 | PRESENT INVENTION |
| 18 | CdTe/ZnS | 1:1 | 980000 | 2500 | 1250000 | PRESENT INVENTION |
| 19 | CdTe/ZaS | 10:1 | 18000 | 400 | 22000 | PRESENT INVENTION |
| 20 | CdTe/ZnS | 50:1 | 1500 | 180 | 1900 | PRESENT INVENTION |
| 21 | CdTe/ZnS | 100:1 | 520 | 80 | 690 | PRESENT INVENTION |
| 22 | InP/ZnS | — | 620 | 105 | 76 | COMPARATIVE EXAMPLE |
| 23 | CdSe/ZnS | — | 550 | 90 | 150 | COMPARATIVE EXAMPLE |
| 24 | CdTe/ZnS | — | 620 | 100 | 80 | COMPARATIVE EXAMPLE |

*CONTAINED NUMBER: A NUMBER OF SEMICONDUCTOR NANOPARTICLES CONTAINED IN A SEMICONDUCTOR NANOPARTICLE ASSEMBLY

It is clear from the results shown in Table 1 that the semiconductor nanoparticle assemblies of the present invention have superiority in emission luminance over the semiconductor nanoparticle assembly of the conventional examples. Accordingly, it is recognized that the semiconductor nanoparticle assembly of the present invention does not cause concentration quenching even if the semiconductor nanoparticles are accumulated into a highly concentrated state, and also has high luminance.

The invention claimed is:

1. A semiconductor nanoparticle assembly containing semiconductor nanoparticles each having a core/shell structure, wherein:
the semiconductor nanoparticles are bonded to each other by amide bonding, and
an average particle size of the assembly is within a range of 50 to 500 nm.

2. The semiconductor nanoparticle assembly according to claim 1, wherein the semiconductor nanoparticle assembly, in which the semiconductor nanoparticles are bonded to each other by the amide bonding, is formed by reacting amino-terminated core/shell semiconductor nanoparticles and carboxyl-terminated core/shell semiconductor nanoparticles.

3. The semiconductor nanoparticle assembly according to claim 1, wherein a raw material configuring the core portion of each of the semiconductor nanoparticles having a core/shell structure is selected from a group including indium phosphor (InP), cadmium selenide (CdSe), and cadmium telluride (CdTe).

4. The semiconductor nanoparticle assembly according to claim 1, wherein the amide bonding is formed by reacting amino-terminated core/shell semiconductor nanoparticles with carboxyl-terminated core/shell semiconductor nanoparticles.

5. The semiconductor nanoparticle assembly according to claim 1, wherein the amide bonding is a single amide bond between the semiconductor nanoparticles.

6. The semiconductor nanoparticle assembly according to claim 1, wherein the semiconductor nanoparticles are made by a liquid phase method.

* * * * *